United States Patent [19]

Von Ammon et al.

[11] Patent Number: 5,746,825
[45] Date of Patent: May 5, 1998

[54] METHOD FOR DETERMINING THE DIAMETER OF A GROWING MONOCRYSTAL

[75] Inventors: Wilfried Von Ammon, Burghausen; Herbert Weidner, Haiming; Ludwig Thanner, Neuötting, all of Germany

[73] Assignee: Wacker Siltronic Gesellschaft für Halbleitermaterialien AG, Burghausen, Germany

[21] Appl. No.: 686,118

[22] Filed: Jul. 23, 1996

[30] Foreign Application Priority Data

Aug. 10, 1995 [DE] Germany ............. 195 29 485.8

[51] Int. Cl.$^6$ ............................................. C30B 15/20
[52] U.S. Cl. ............................ 117/14; 117/13; 117/15; 117/201
[58] Field of Search .................. 117/13, 14, 15, 117/35, 37, 201, 202, 900

[56] References Cited

U.S. PATENT DOCUMENTS

| | | | |
|---|---|---|---|
| 4,350,557 | 9/1982 | Scholl et al. | 117/15 |
| 4,794,263 | 12/1988 | Katsuoka et al. | 117/201 |
| 4,832,496 | 5/1989 | Thomas | 356/384 |
| 5,223,078 | 6/1993 | Maeda et al. | 117/15 |
| 5,240,684 | 8/1993 | Baba et al. | 117/14 |
| 5,487,354 | 1/1996 | Von Ammon et al. | 117/13 |
| 5,567,399 | 10/1996 | Von Ammon et al. | 117/217 |

FOREIGN PATENT DOCUMENTS

| | | |
|---|---|---|
| 2923240 | 12/1980 | Germany. |
| 1209580 | 10/1970 | United Kingdom. |

OTHER PUBLICATIONS

Journal of the Electrochemical Society, Jun. 1974, USA, vol. 121, No. 6, ISSN 0013–4651, pp. 822–826, XP 002014771, Pruett et al. "X–ray Imaging Technique for Observing Liquid Encapsulation Czochralski Crystal Growth" 3rd International Conference on Crystal Growth,. Marseille France 5–9 Jul. 1971, vol. 13–14, ISSN 0022–0248, Journal of Crystal Growth, May 1972 Netherlands, pp. 619–623 XP 0002014772.

Gartner K.J. et al.; "An Electronic Device Including a TV–System for Controlling the Crystal Diameter During Czochralski Growth".

*Primary Examiner*—Felisa Garrett
*Attorney, Agent, or Firm*—Collard & Roe, P.C.

[57] ABSTRACT

A method and a device is provided for determining the diameter of a monocrystal growing at a crystallization boundary during the pulling of the monocrystal from a melt. The method includes imaging a part of the crystallization boundary on at least one mirror, observing the mirror image and determining the diameter of the monocrystal from the observed relative position of the crystallization boundary on the mirror image.

5 Claims, 2 Drawing Sheets

METHOD FOR DETERMINING THE DIAMETER OF A GROWING MONOCRYSTAL

BACKGROUND OF THE INVENTION

1. Field of the Invention

The present invention relates to a method for determining the diameter of a monocrystal growing at a crystallization boundary during the pulling of the monocrystal from a melt. The invention also relates to a device for carrying out the method.

2. The Prior Art

During the pulling of monocrystals composed of semiconductor material by the so-called Czochralski method, it has to be possible to monitor the diameter of the monocrystal, that is to be able to determine and, if necessary, to modify it. The diameter of the monocrystal, which depends on the radial growth of the monocrystal at the crystallization boundary, can be modified, for example, by altering the pulling speed or the temperature of the melt in the region of the crystallization boundary in a controlled manner.

A simple estimation of the diameter of the monocrystal is possible even by observing the monocrystal and the crystallization boundary through a viewing window in the pulling device. U.S. Pat. No. 4,350,557 describes an automated optical method for monitoring the diameter of a monocrystal, in which the determination of the diameter is based on a measurement of electromagnetic radiation which is reflected from the meniscus at the crystallization boundary. U.S. Pat. No. 4,794,263 discloses a device which is suitable for determining the diameter of the growing monocrystal by measuring the luminosity of the meniscus and the level of the melt. U.S. Pat. No. 5,223,078 reveals a method which serves to monitor the pulling of the conical portion at the tip of the monocrystal (initial cone) and to shorten the length of said portion since it is unsuitable for the production of electronic components.

However, it is not possible to determine the diameter of the monocrystal with the methods mentioned while the conical portion at the end of the monocrystal (terminal cone) is being pulled. During this phase of the crystal pulling, the cylindrical portion of the monocrystal, which is normally pulled after the initial cone, obscures the view of the crystallization boundary. The terminal cone has therefore to be pulled virtually "blind", that is to say without a reliable possibility of determining the diameter of the monocrystal. This frequently results in unintentional fluctuations in the radial growth, which increase the formation of dislocations.

Particularly disadvantageous is a breaking of the contact between melt and growing monocrystal. In this case, not only does the formation of dislocations occur, but damage may also occur to the graphite parts of the pulling system as a result of the generation of surface waves on the melt surface and as a result of melt splashes. The dislocations generated propagate from the point at which they are produced about one crystal-diameter length back into the monocrystal already pulled. Since dislocated semiconductor material is unusable for electronic purposes, the damage is particularly large if monocrystals having diameters of more than 150 mm are affected by the production of dislocations during the pulling of the terminal cone. The dislocations then extend particularly far into the cylindrical portion of the monocrystal, which is normally used to produce electronic components and is in any case substantially shorter in the case of monocrystals of this order of size due to process limitations than in the case of monocrystals having smaller diameters.

SUMMARY OF THE INVENTION

It is an object of the present invention to provide a method in which fluctuations in the radial growth of the monocrystal and the production of dislocations, in particular during the pulling of the terminal cone, can be avoided.

The above object is achieved according to the present invention by providing a method for determining the diameter of a monocrystal growing at a crystallization boundary during the pulling of the monocrystal from a melt, which method comprises imaging a part of the crystallization boundary on at least one mirror, observing the mirror image and determining the diameter of the monocrystal from the observed relative position of the crystallization boundary on the mirror image.

The method permits the constant monitoring of the diameter of a monocrystal in the region of the crystallization boundary. It makes it possible, in particular, for the terminal cone also to be capable of being pulled in a controlled manner since unintentional changes in the diameter can immediately be detected and corrected. The method permits the pulling of the terminal cone to be automated in a particularly advantageous manner. In addition, the method permits the terminal cone to be pulled shorter than has hitherto been usual.

The information about the diameter which the growing monocrystal instantaneously has at its crystallization boundary is obtained from the observation of a mirror image which is revealed by a mirror which images at least a part of the crystallization boundary. The crystallization boundary is clearly recognizable in the mirror image from the sharply demarcated change in brightness between the monocrystal imaged at the top and the melt imaged underneath. Provided the diameter of the monocrystal does not change or is not changed during the crystal pulling, the position of the crystallization boundary on the mirror image also remains unaltered. If the diameter of the monocrystal grows, the imaged part of the monocrystal increases so that an observer sees the crystallization boundary in the mirror image migrate downward. In the case of decreasing crystal diameter, the conditions are precisely reversed so that the imaged crystallization boundary as seen by the observer migrates upward on the mirror image during the pulling of the terminal cone. A certain crystal diameter can therefore be correlated with the relative position of the imaged part of the crystallization boundary on the mirror image. The correlation is carried out, for example, by calibration using measurement results of diameter determinations which are performed during the pulling of the initial cone at the same time as observing the mirror, the measurements being based on known methods and in some cases being described in the above-mentioned patents.

Of course, an estimation of the diameter is also possible without prior calibration. An engineer experienced in pulling monocrystals will observe the crystallization boundary first directly and in the mirror through the viewing window of the pulling system. During the pulling of the terminal cone, when the direct observation of the crystal boundary is no longer possible, the sole observation of the mirror is then sufficient to decide whether and in which direction the diameter has to be changed.

According to a preferred embodiment of the method, a series of mirror images is recorded by an electronic camera during the pulling of the monocrystal. Each mirror image is processed by means of a computer to form a data set which contains the information about the crystal diameter represented by the mirror image. This is done by detecting the relative position of the crystallization boundary on the mirror image as a distinctive feature and correlating it with a certain diameter during the electronic image processing. The diameter correlated with a mirror image is a calibration value which has been obtained by a diameter determination known per se which was carried out at the same time as observing the mirror image during the pulling of the initial cone. The mirror images which can be observed during the pulling of the initial cone of the monocrystal can be observed again in reverse order during the pulling of its terminal cone. It is therefore sufficient to generate data sets of the pulling of the initial cone and of the cylindrical part of the monocrystal. During the pulling of the terminal cone of the monocrystal, when the known methods of diameter determination break down, only the position of the crystallization boundary is then determined on the mirror image and is correlated with the corresponding crystal diameter by means of the previously generated data sets. In principle, a certain diameter could also be correlated with an observed mirror image by determining the corresponding diameter by means of geometrical calculations.

With a sufficiently large number of data sets, the diameter of the monocrystal can be determined at any instant in time in the crystal pulling. In principle, it is possible to pull a plurality of monocrystals one after another in a pulling system and to use the data sets generated during the pulling of the first monocrystal to determine the diameter of a monocrystal. Since the mirror has to be cleaned or, if necessary, replaced after every crystal pulling, it is also preferable to generate new data sets during the pulling of the initial cone of a new monocrystal and then to use them to determine the diameter of the monocrystal, in particular, when he terminal cone of the monocrystal is being pulled.

The determination of the diameter of a monocrystal from an observed mirror image is used to keep the diameter of the monocrystal in conformity with a given specified diameter. If a determination of the diameter reveals a deviation from the specified diameter, the pulling conditions, for example the pulling speed or the temperature of the melt in the region of the crystallization boundary, are altered so that the diameter of the monocrystal adjusts again to the specified diameter.

The present invention also relates to a device for determining the diameter of a monocrystal growing at a crystallization boundary during the pulling of the monocrystal from a melt. It has at least one observable mirror which is disposed at the side of the growing monocrystal and is inclined so that a part of the crystallization boundary is imaged on its surface.

BRIEF DESCRIPTION OF THE DRAWINGS

Other objects and features of the present invention will become apparent from the following detailed description considered in connection with the accompanying drawing which discloses several embodiments of the present invention. It should be understood, however, that the drawing is designed for the purpose of illustration only and not as a definition of the limits of the invention.

In the drawing, wherein similar reference characters denote similar elements throughout the several views.

DETAILED DESCRIPTION OF PREFERRED EMBODIMENTS

Figure 1:
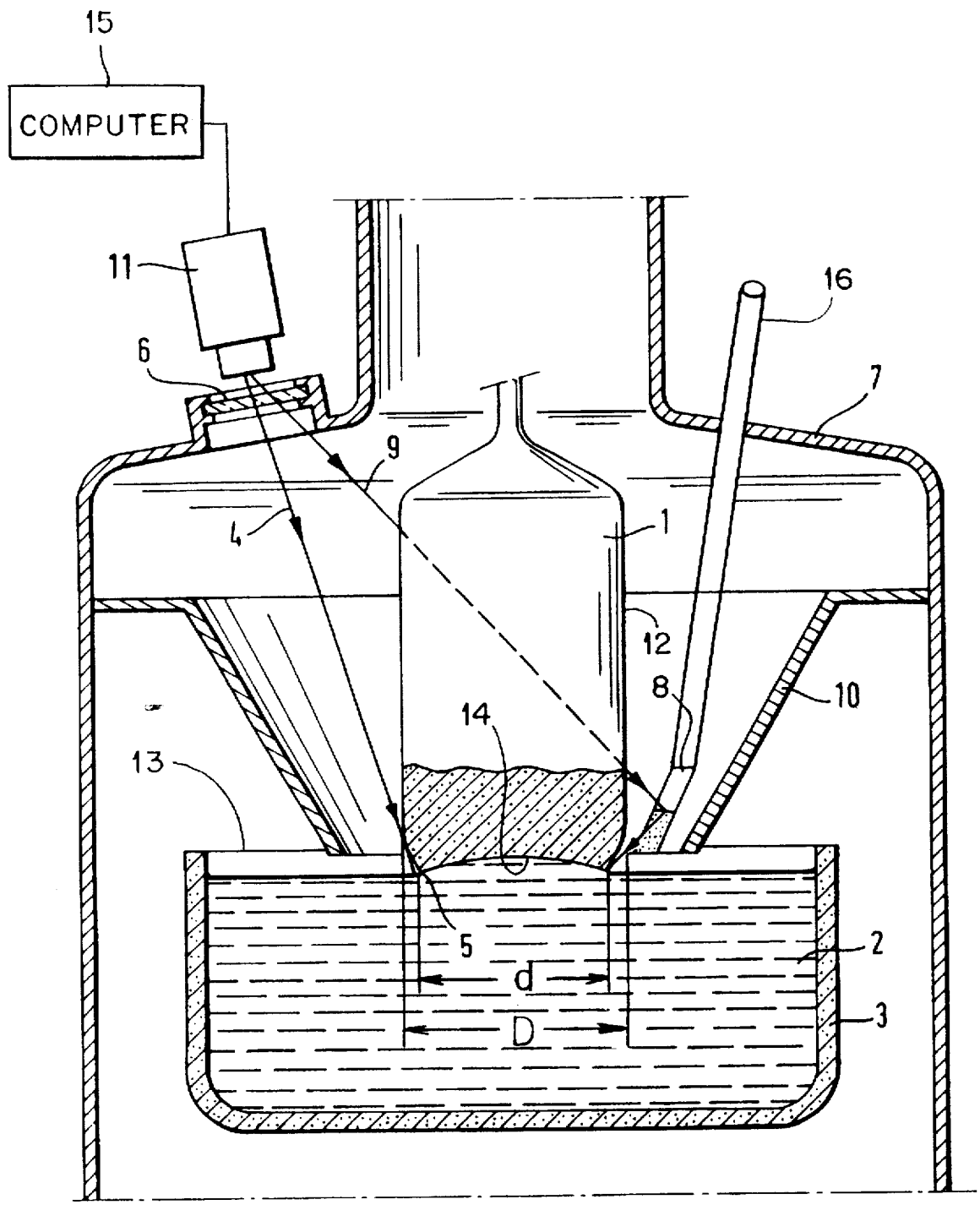
FIG. 1 shows diagrammatically a pulling system for pulling a monocrystal from a melt.

Turning now in detail to the drawings, FIG. 1 shows the situation during the pulling of the terminal cone 14 of the monocrystal 1. The monocrystal is pulled with the aid of a pulling apparatus, known per se and therefore not shown, from a melt 2. The melt is held by a crucible 3. The view 4 of the crystallization boundary 5 through the viewing window 6 in the bell jar 7 is not possible during this phase of the crystal pulling because a part of the already pulled cylindrical portion of the monocrystal obscures the crystallization boundary. A mirror 8 is therefore provided which is disposed at the side 12 of the monocrystal 1 and is inclined with respect to the growth direction of the monocrystal so that a part of the crystallization boundary 5 is imaged thereon and can be observed from a viewing direction 9 through the viewing window 6, for example with the aid of a camera 11. Optionally, a plurality of mirrors can also be provided which are, for example, inclined to different extents or are spaced at different distances from the surface 13 of the melt. The camera 11 may be an electronic camera and the information may be processed by a computer 15.

As is known during the pulling of silicon monocrystals by the Czochralski method, gaseous silicon monoxide escapes from the melt and may deposit as a solid on the colder parts of the system. It is therefore necessary for the mirror 8 to be flushed with inert gas and thereby kept free of deposits. Since the bell jar is normally flushed with inert gas in any case and an inert-gas stream is fed to the melt between the growing monocrystal and a heat shield, the mirror 8 is preferably mounted on a conical or tubular heat shield 10 disposed above the melt 2. It is, of course, also possible to mount the mirror at the tip of a lance 16 which is specially provided for the purpose and which is held in the space above the melt, and to flush it with inert gas, if necessary, via a special apparatus. German Patent Application with Application No. P 195 03 357 discloses a coolable heat shield composed of silver. If the internal wall of such a heat shield is mirror-finished at a suitable point, it can be used as a mirror in the context of the invention. In addition, a mirror composed of mirror-finished silicon is particularly preferred, especially if monocrystals composed of silicon are being pulled. Preferably, the mirror is made of a polished silicon wafer, the basic material for the production of electronic components.

Figure 2A:
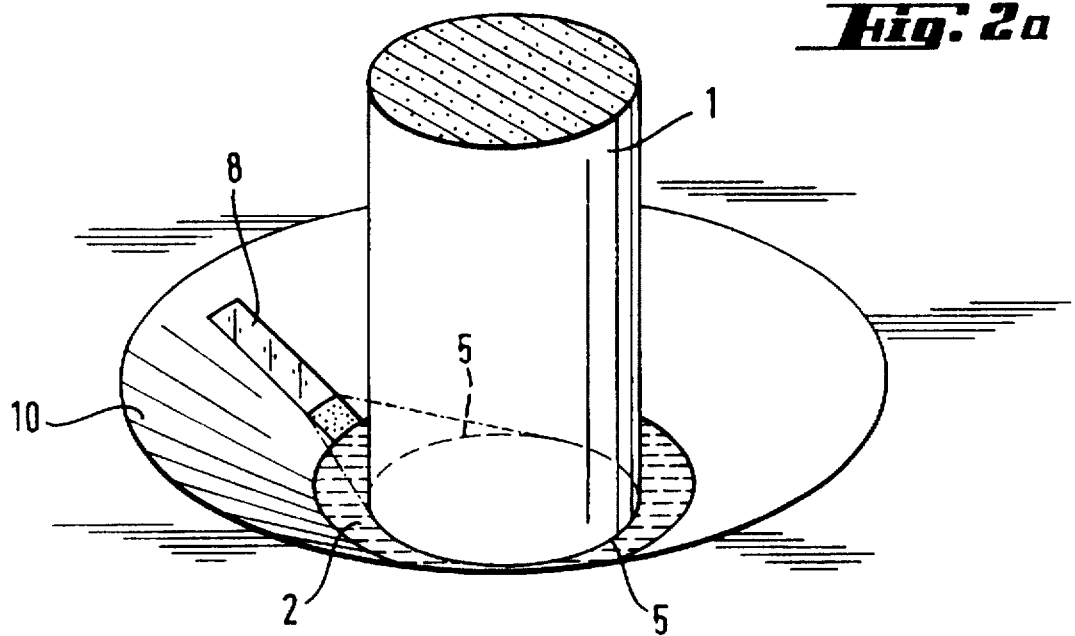
FIGS. 2a and 2b diagrammatically represent the view of the pulling system at different instants in time in a crystal pulling.
Figure 2B:
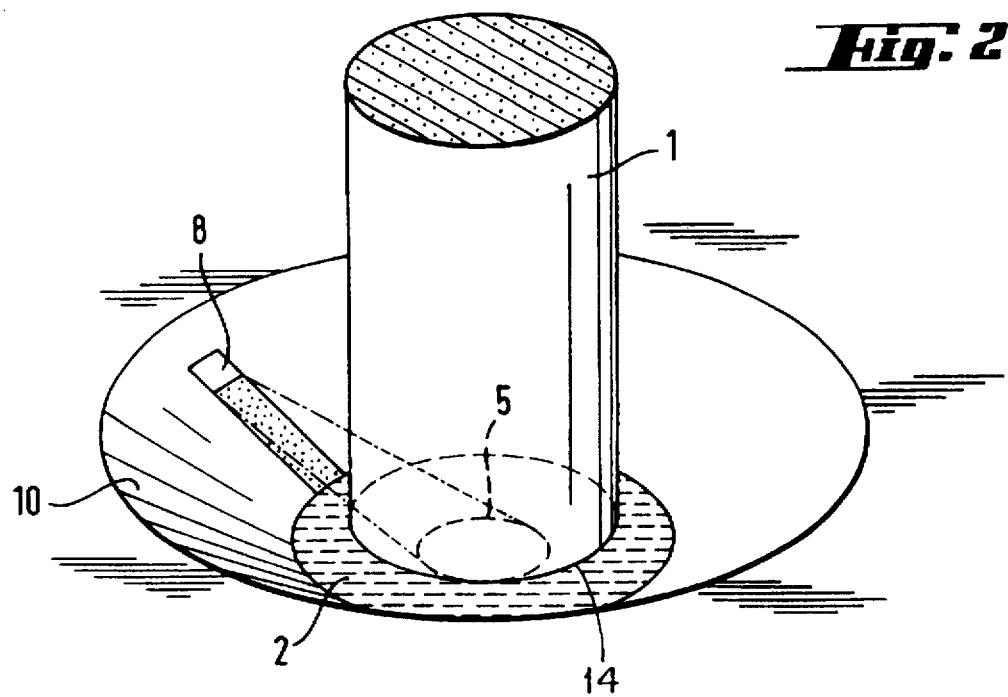

FIG. 2a shows the viewing field of the camera 11 (FIG. 1) at an instant in time at which the cylindrical part of the monocrystal 1 is being pulled. The imaged part of the crystallization boundary is recognizable from a sharply demarcated change in brightness on the mirror 8, which is mounted on the heat shield 10. This change in brightness is observed at a higher position on the mirror at a later instant in time at which the terminal cone 14 of the monocrystal is being pulled (FIG. 2b) and the diameter D of the monocrystal 1 has become the smaller diameter d as shown in FIG. 1.

While several embodiments of the present invention have been shown and described, it is to be understood that many changes and modifications may be made thereunto without departing from the spirit and scope of the invention as defined in the appended claims.

What is claimed is:

1. A method for determining a diameter of a monocrystal growing at a crystallization boundary during a pulling of the monocrystal from a melt, which method comprises imaging a part of the crystallization boundary on at least one mirror to produce a mirror image;

observing a relative position of the crystallization boundary on the mirror image in a final phase of the pulling of the monocrystal when the diameter of the monocrystal is reduced to form a terminal cone;

determining the diameter of the monocrystal on a basis of an observed relative position of the crystallization boundary on the mirror image; and using the information contained in the mirror image about the diameter of the monocrystal to change the diameter of the monocrystal if necessary.

2. The method as claimed in claim 1, comprising correlating a certain relative position of the crystallization boundary on the mirror image with the diameter of the monocrystal which emerges from a determination of the diameter.

3. The method as claimed in claim 1, comprising recording mirror images by an electronic camera during the pulling of the monocrystal and processing the images by a computer to form data sets which contain information about the diameter of the growing monocrystal; and using this information to change the diameter of the monocrystal if necessary.

4. The method as claimed in claim 1, comprising mounting the mirror at a tip of a lance which is disposed above the melt; and flushing the mirror with inert gas.

5. The method as claimed in claim 1, comprising mounting the mirror on a heat shield which is disposed above the melt; and flushing the mirror with inert gas.

* * * * *